United States Patent [19]

Kimoto et al.

[11] Patent Number: 5,250,149

[45] Date of Patent: Oct. 5, 1993

[54] METHOD OF GROWING THIN FILM

[75] Inventors: Tsunenobu Kimoto; Tadashi Tomikawa; Nobuhiko Fujita, all of Hyogo, Japan

[73] Assignee: Sumitomo Electric Industries, Ltd., Osaka, Japan

[21] Appl. No.: 664,581

[22] Filed: Mar. 6, 1991

[30] Foreign Application Priority Data

| Mar. 6, 1990 [JP] | Japan | 2-55819 |
| Mar. 16, 1990 [JP] | Japan | 2-67762 |
| Dec. 12, 1990 [JP] | Japan | 2-418950 |

[51] Int. Cl.$^5$ ............................................. C30B 29/04
[52] U.S. Cl. .................................... 156/612; 156/610; 156/DIG. 68; 423/446; 502/86; 437/937; 437/946
[58] Field of Search ............. 156/610, 614, DIG. 468; 423/446; 302/86; 427/39; 148/DIG. 17; 437/937, 946

[56] References Cited

U.S. PATENT DOCUMENTS

| 3,501,336 | 3/1970 | Dyer et al. | 437/946 |
| 3,522,118 | 7/1970 | Taylor et al. | 437/946 |
| 3,714,334 | 1/1973 | Vickery | 423/446 |
| 4,436,761 | 3/1984 | Hayashi et al. | 437/937 |
| 4,605,479 | 8/1986 | Faith | 148/DIG. 17 |
| 4,816,286 | 3/1989 | Hirose | 423/446 |
| 5,015,494 | 5/1991 | Yamazaki | 423/446 |

FOREIGN PATENT DOCUMENTS

| 370775 | 5/1990 | European Pat. Off. | 437/946 |
| 59-137396 | 8/1984 | Japan | 423/446 |
| 60-186500 | 9/1985 | Japan . | |
| 63-121667 | 5/1988 | Japan . | |
| 63-185894 | 8/1988 | Japan . | |
| 1-093412 | 4/1989 | Japan . | |
| 1-096099 | 4/1989 | Japan . | |
| 1-191780 | 8/1989 | Japan . | |
| 2128637 | 5/1984 | United Kingdom . | |
| 2219578 | 12/1989 | United Kingdom | 423/446 |

OTHER PUBLICATIONS

Gildenblat et al. "High Temperature Schottky Diodes with Buron Doped Homoepitaxial Diamond Base", Mat. Res. Bull. vol. 25 (1) Jan. 1990 pp. 129-134.

Jeng et al., "Oriented Cubic Neucleations and Local Epitaxy During Diamond Growth on Silicon (100) Substrates", Applied Physics Letters, vol. 56, #20, pp. 1968-1970, May 14, 1990.

Shiomi et al., "Epitaxial Growth of High Quality Diamond Film by the Microwave Plasma Assisted Chemical Vapor Deposition Method", Japanese Journal of Applied Physics, vol. 29, No. 1, pp. 34-40, Jan. 1990.

Primary Examiner—Robert Kunemund
Attorney, Agent, or Firm—Cushman, Darby & Cushman

[57] ABSTRACT

A heating process for producing a high quality diamond or c-BN film on a diamond or c-BN substrate comprising placing a diamond or c-BN substrate in vacuum, elevating the temperature and treating its surface with a chlorine containing gas, a fluorine containing gas, a nitrogen containing plasma or a hydrogen containing plasma. The treatment gas is then removed and feed gases are introduced which are suitable for growing a thin diamond or c-BN film on the surface substrate under chemical vapor deposition conditions.

10 Claims, 5 Drawing Sheets

HF TREATMENT TEMPERATURE AND DENSITY OF ETCH PIT OF DIAMOND GROWN LAYER

TREATMENT (NO TREATMENT) OF HF AND HOLE MOBILITY

H₂ PLASMA POWER AND DENSITY OF ETCH PIT

METHOD OF GROWING THIN FILM

FIELD OF THE INVENTION

The present invention relates to a method of preparing improved diamond and c-BN films on a substrate.

BACKGROUND OF THE INVENTION

Semiconducting diamonds are drawing attention as new materials for use in semiconductor devices, including diodes, transistors and sensors. Diamonds are known widely today as good electrical insulators. However, the diamonds of interest in the present invention are semiconducting diamonds with low specific resistance. Diamond has a wide energy gap (5.5 eV) and a high carrier mobility (2,000 $cm^2/V \cdot sec$) and is both thermally and chemically stable. Thus, semiconducting diamonds hold significant promise as excellent materials for use in environmentally resistant, high-speed or power devices and blue light emitting devices.

Semiconducting diamonds are available in three/-types, natural bulk, high-pressure synthesized buld and vapor-phase synthesized thin film. Diamonds of p-type are obtained by doping the diamond film with boron (B). Diamonds of n-type are obtained by doping the diamond film with phosphorus (P) or lithium (Li). The n-type diamonds possess high resistance. Low-resistance n-type diamonds are not yet to be obtained.

Bipolar devices cannot be fabricated from semiconducting diamonds. However, Schottky diodes which make use of Schottky junction between tungsten (W) and a p-type diamond, as well as several types of unipolar transistors are currently being fabricated in the laboratory.

Methods which are commonly used to grow thin films of semiconducting diamonds include microwave plasma assisted CVD techniques and a hot filament assisted CVD techniques. In these methods, feed gases such as $CH_4$, CO and $H_2$ are decomposed using a microwave induced plasma or a hot filament. This results in the formation of thin diamond films on a heated substrate made of silicon (Si), molybdenum (Mo), diamond, etc. Addition of $B_2H_6$ to the feed gases allows thin films of p-type diamond can be obtained.

Cubic boron nitride (c-BN) has also shown promise as a wide bandgap semiconductor. Specifically, c-BN is drawing attention as a material suitable for use in environmentally resistant devices, power devices and ultraviolet to blue light emitting devices. Like diamond, c-BN is also a material that has high chemical, thermal and physical stability. In addition, c-BN has a wide bandgap.

Boron nitride (BN) is a compound made up of boron and nitrogen and is available in various structures including h-BN, t-BN and a-BN. Hexagonal boron nitride (h-BN) is easy to prepare. Cubic boron nitride systems (c-BN) are not easy to prepare. Doping with Be, produces p-type c-BN. Doping with S or Si produces, n-type c-BN.

In order to fabricate devices which use semiconducting diamonds or c-BN, it is necessary to provide thin films of high-quality crystals with few dislocation and point defects. Conventionally, these films are formed by heating the substrate to a suitable temperature under a suitable degree of vacuum and introducing the feed gases immediately to grow a thin film.

FIG. 2 illustrates the conventional process of forming thin diamond or c-BN films. The horizontal axis of the diagram in FIG. 2 plots time and the vertical axis plots the temperature of the substrate. Above the temperature profile are indicated the steps of the process, temperature elevation, growing the film, and temperature lowering. Two successive steps are differentiated by a vertical line. The gas or gases to be introduced are indicated in the space defined by the temperature line and the partition lines.

After a suitable vacuum is drawn, $H_2$ gas is introduced into the vacuum chamber and the temperature is raised. When the substrate has been heated to an appropriate growth temperature, feed gases, $CH_4$, $H_2$ and optionally, $B_2H_4$, are introduced. $B_2M_6$ is added to the reaction when a p-type crystal is to be formed.

The introduced gases are excited by microwaves, heat, a high-frequency plasma, and other excitation methods. This causes the feed gas to enter into a vapor-phase reaction. This reaction forms a thin film of diamond or c-BN on the substrate.

However, the thin films obtained by the use of these conventional methods of vapor-phase synthesis contain a fairly large number of detects. In thin films, those which are not thicker than 1 $\mu m$, the deterioration in the quality of the film is substantial. These low quality thin films make it impossible to fabricate devices that make use of the inherently good physical properties of the starting materials. As will be discussed hereinafter, this results because either impurities remain or oxide films form on the surface of the substrate. An object, therefore, of the present invention is to provide a method of vapor-phase synthesis of a thin diamond or c-BN film that has sufficiently high quality to justify their use in semiconductor and other suitable devices.

SUMMARY OF THE INVENTION

The present invention relates a method of forming a diamond film or a c-BN film on a substrate comprising: first pre-treating a substrate, which has been placed in a vacuum chamber and raised to an elevated temperature, with a composition selected from a chlorine containing gaseous mixture, a fluorine containing gaseous mixture, a nitrogen containing plasma, or a hydrogen containing plasma. After the pre-treatment, the pre-treatment mixture is evacuated from the chamber and the feed gas mixture for producing the diamond or c-BN film is placed in the vacuum chamber under deposition conditions and the thin film is formed.

DETAILED DESCRIPTION OF THE PREFERRED EMBODIMENTS

Figure 1:
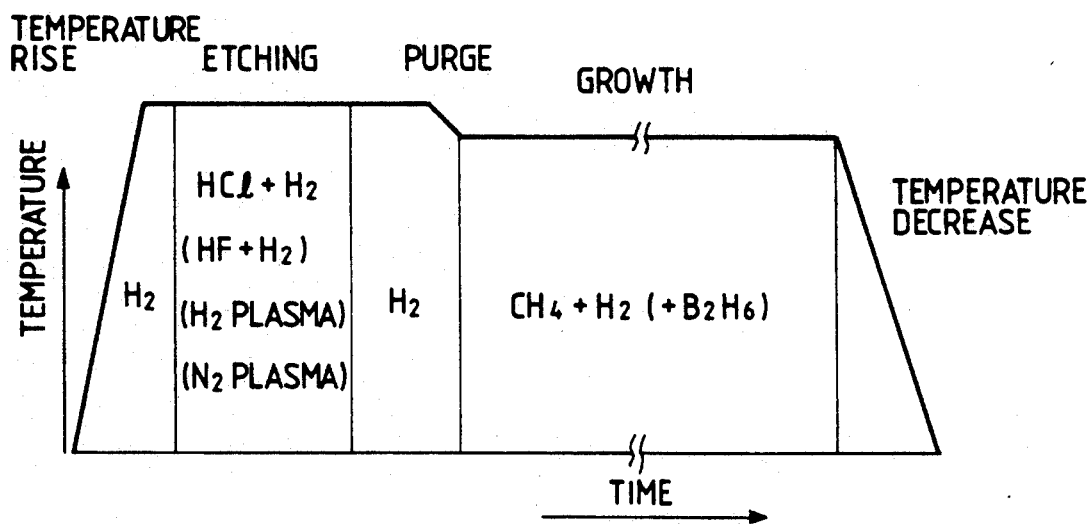
FIG. 1 is a diagram showing the program for thin film growth in accordance with the present invention. The horizontal axis of FIG. 1 plots time and the vertical axis plots the temperature of a substrate. The temperature profile is divided by vertical lines for the respective steps and the gas or gases to be supplied in the individual steps are also indicated.

The present invention relates to a method of forming a thin film which involves the performance of a preliminary pre-treatment on the surface of a diamond or c-BN substrate with a chlorine or fluorine containing gaseous mixture or a nitrogen or hydrogen containing plasma prior to the growth of a thin diamond or c-BN film on the substrate.

In the method of the present invention, the temperature of the substrate is elevated just prior to the growth of an epitaxial film in vacuum. Thereafter, a chlorine or fluorine containing gaseous mixture or a nitrogen or hydrogen containing plasma is introduced. This pre-treatment cleans the surface of the substrate. Subsequently, the chlorine or fluorine containing gaseous mixture or the nitrogen or hydrogen containing plasma is completely removed from the vacuum chamber and feed gases are introduced for thin film formation under film forming conditions. This results in the formation of epitaxial films of high quality.

The reasons for the above are the following. When the thin-film crystals are grown on substrates, the state of the outermost surface of the substrate generally exerts substantial effects on the quality of thin layer. For Si and GaAs substrates, substrate control technology is already established. Thus, their surface state can be strictly controlled. However, for diamond and c-BN substrates, which are new semiconductors, the control of the substrate's surface is still unsatisfactory.

Impurities such as grease and metals, which result from the grinding and polishing operation, will usually remain on the surface of diamond and c-BN substrates. In addition, in some cases, thin oxide films are formed on the substrate surface. Most of these surface contaminants can be removed by cleaning the substrates with various organic solvents or acids but it is difficult to remove them completely.

The surfaces of substrates also contain work strains which occur when the substrates are polished with iron tools in order to permit reaction with iron to obtain a smooth surface. In this case, the resulting surface is apparently smooth but the microstructure is disturbed and has a graphite layer in it.

If thin-film crystals are grown on such substrates, the residual impurities on the substrate can become sites for the initiation of the growth of abnormal nuclei or the occurrence of dislocations. Thus, contaminations on the substrate's surface will increase the number of defects in the resulting thin layer which is grown thereon. This contamination can also deteriorate the interface characteristics of a device which is fabricated using the grown layer. The same problems result from the presence of work strains. In order to obtain thin-film crystal layers of high quality, it is necessary to use a growth substrate that is free from contamination and work strain.

As noted above, the outermost surfaces of diamond or c-BN substrates are not only contaminated with various impurities (e.g. grease and Fe) but also may contain work strains. These work strain defects cannot be completely removed by conventional methods of cleaning the substrates. If impurities were the only problem to consider, they could be removed by cleaning the substrate. However, the substrate can potentially be re-contaminated before it is set in the growth apparatus.

To avoid these problems, a chlorine or fluorine containing gaseous mixture or a nitrogen or hydrogen containing plasma is introduced after the temperature of the substrate is elevated, prior to the growth of a thin diamond or c-BN layer on the substrate. This leads to the following results:

(1) contaminations and impurities on the surface of the substrate are removed by the chlorine or fluorine containing gaseous mixture or the nitrogen or hydrogen containing plasma; and (2) the chlorine or fluorine containing gaseous mixture or the nitrogen or hydrogen containing plasma that are introduced at elevated temperatures lightly etch the surface of the substrate so as to remove any work strains in it.

The growth of an epitaxial layer on the thus prepared, clean substrate, provides a diamond or c-BN layer that is thin but which yet has high quality. In particular, since the substrate is etched within a vacuum apparatus and is not taken out of it thereafter, there is no potential risk of re-contamination.

Thus, the method of the present invention requires a preliminary treatment of the substrates with a chlorine or fluorine containing gaseous mixture or a nitrogen or hydrogen containing plasma.

This pre-treatment allows stains and work strains to be efficiently removed from the surfaces of the substrates. The cleaned substrates allows deposition of thin films of diamond or c-BN of improved crystallinity. As a result, higher carrier mobilities can be attained while a smaller leak current will flow through a pn junction or a Schottky junction during application of a reverse bias. In Examples 1–28, only a Schottky junction is described but a pn junction can also be formed by incorporating dopants into the junction. The above described advantages are particularly apparent when the thickness of the grown layers decreases. Therefore, the present invention is extremely useful for the purpose of improving the characteristics of diodes, transistors and other semiconductor devices using diamond, c-BN or the junction between diamond and c-BN.

The method of thin film growth of the present invention involves the use of a preliminary step which comprises elevating the temperature of a diamond or c-BN substrate in a growth apparatus and introducing a gaseous mixture containing a gas selected from chlorine, fluorine (e.g. $F_2+H_2$, $HF+H_2$, or $CF_4+H_2$, $Cl_2+H_2$, $HCl+H_2$ or $F_2+Cl_2+H_2$, $CCl_4+H_2$); or a nitrogen containing plasma, or a hydrogen containing plasma. The gaseous mixture or plasma, is then eliminated from the reaction vessel. Subsequently, feed gases are introduced in order to grow a thin film of diamond or c-BN.

As noted above, the present method is characterized by growing a thin film of diamond or c-BN after the substrate is treated preliminarily with a chlorine or fluorine containing gaseous mixture or a nitrogen or hydrogen containing plasma. The preliminary treatment with a chlorine or fluorine containing gaseous mixture or a nitrogen or hydrogen containing plasma cleans and/or partially etches the surface of the substrate. This allows the growth of a single crystal thin film which has few defects. After the preliminary treatment, the substrate is not removed from the growth apparatus, so there is no chance of contamination from the ambient air.

FIG. 1 shows a specific example of the method of thin-film growth of the present invention (for the case of growing a thin diamond film). The horizontal axis of the diagram shown in FIG. 1 plots time and the vertical axis plots the temperature of the substrate. Vertical lines in FIG. 1 separate one step from another, with the name of the separated steps being inciated above the temperature profile. The gas or gasses which are introduced into the vacuum chamber during a particular step are indicated within the enclosure associated with that particular step. Gases or plasmas in parentheses are those which may be used either optionally, alternatively or simultaneously.

The concept of the present invention is suitable for use with any method of epitaxial growth by vapor-phase synthesis. These include microwave assisted CVD, thermal CVD and r-f plasma assisted CVD techniques. Substrates suitable for use in the method of the present invention include diamond or c-BN.

The present process is described in more detail as follows. The substrate is set on a holder in the vacuum chamber. A vacuum is drawn from the chamber. The substrate is heated with a heater, for example, or a microwave-induced plasma, while $H_2$ gas is introduced. After elevation of the temperature of the substrate, a chlorine or fluorine containing gaseous mixture or a nitrogen or hydrogen containing plasma is introduced to etch the surface of the substrate.

Suitable gaseous mixtures for this step include: HCl and $H_2$, introduced as a chlorine containing gas; $HF+H_2$, introduced as a fluorine containing gas; a nitrogen containing plasma or a hydrogen containing plasma may also be introduced.

For the sake of simplicity, the term "etching" is used here to describe the effect of the preliminary step. However, the action of the chlorine or fluorine containing gaseous mixture or the nitrogen or hydrogen containing plasma is a complex cleaning action both chemically and physically and may not be a simple etching action.

The process temperature during the etching must be on the order of 500°-1,200° C. A preferred temperature range is 800°-1000° C. Depending on the capacity of the growth chamber, the flow rate of HCl or HF to be introduced is preferably in the range 1-50 sccm. This amount is also preferred when gases such as $Cl_2$, $CCl_4$, $F_2$ and $CF_4$ are used. The process pressure may be sub-atmospheric or may alternatively be atmospheric, if diluent gases such as $H_2$, Ar and $N_1$ are used in large volumes.

It should be noted that the presence of $O_2$ is undersirable when a diamond substrate is used. This is because the elevation of the substrate temperature in the presence of $O_2$ causes the substrate to be etched with $O_2$ which causes problems, such as surface roughening.

In any atmosphere, diamond heated to a temperature of 1,300°-1,400° C. and above will undergo phase transfer to graphite. c-BN heated to temperatures of 1500° C. and above will change to h-BN. As a result, heating diamond or c-BN substrates to these high temperatures should be avoided.

In another embodiment of the invention, substrate may be etched using a nitrogen or hydrogen containing plasma. Nitrogen and hydrogen in gaseous form are incapable of chemically etching the substrate. However, upon excitation to a plasma state, they are activated and become capable of etching and cleaning the substrate. In this embodiment, the substrate is first heated, with a heater or a microwave induced plasma, while $H_2$ gas is introduced, for its temperature becomes higher than the epitaxial growth temperature. Then, a nitrogen or hydrogen containing plasma is generated to etch the substrate.

Any means of plasma generation may be employed. Suitable plasma sources include direct-current plasma, r-f plasma, microwave-induced plasma, capacitively coupled plasma, inductively coupled plasma and ECR (electron cyclotron resonance) plasma, etc. The desired cleaning results can be obtained by optimizing the conditions of the specific plasma-generating apparatus. These include gas flow rate, pressure, power to be supplied to the plasma, the temperature of the substrate, the bias voltage on the substrate and the processing time. The surface of the substrate cannot be thoroughly cleaned if the power supplied to the plasma is too low. On the other hand, if the power supplied to the plasma is too high, excessive etching occurs which roughens the surface of the substrate. It should be noted that the treatment with plasma is performed just prior to epitaxial growth on the substrate. That is, immediately before the formation of an epitaxial film in the growth chamber. If the substrate is etched in a separate chamber, it should be transferred to the growth chamber with the desired temperature and vacuum conditions being maintained.

Whether the substrate is etched with chlorine or fluorine containing gaseous mixture, as already described above, or with a nitrogen or hydrogen containing plasma, the cleaned substrate must not be taken out of the chamber where the etching has been performed.

After etching with the chlorine or fluorine containing gaseous mixture, the etching gas must be fully purged from the vacuum chamber. For example, a HCl or HF gas must be displaced. To achieve this, the introduction of the chlorine or fluorine gaseous mixture is ceased. A high vacuum is then drawn from the vacuum chamber. $H_2$ gas is then introduced to insure that the vacuum chamber is completely purged of the chlorine or fluorine gas.

The subsequent film forming procedures are the same as in the conventional process of growing thin films of diamond or c-BN. First, feed gases, such as $CH_4+H_2$ ($B_2H_6$ is also supplied if a p-type semiconductor is to be formed) are introduced into the vacuum chamber. A thin film is grown on the substrate with its temperature, pressure and other parameters being maintained at the appropriate values. When the growth of thin film is complete, the introduction of the feed gases is ceased and the temperature of the substrate is lowered.

On the following pages, examples of the present invention are described with reference to three typical types of etchants; in one case, chlorine gas is used; in another case, fluorine gas is used; and in the third case, a hydrogen or nitrogen plasma is used as an etchant.

EXAMPLE 1

Pre-Treatment with Chlorine Gas

A type Ib diamond substrate and an undoped c-BN substrate were used. Both substrates were produced by a high-pressure synthesis method. A thin diamond film was grown on these substrates in the following manner.

Prior to placement in a growth chamber, each of the diamond and c-BN substrates was cleaned by sonication with an organic solvent, treated with fluoronitric acid and aqua regia, and rinsed with ultrapure water. In Example 1, HCl gas was used as a chlorine containing gas to clean the substrates.

The HCl treatment prior to the growth of a thin diamond film was conducted under the following conditions:

| Gas flow rate: | HCl = 5 sccm |
| --- | --- |
|  | H2 = 300 sccm |
| Pressure: | 12 Torr |
| Process temperature: | R.T. - 1,000° C. |
| Process time: | 10 min |

A thin diamond film was grown on the thus treated substrates as they were isolated from the atmosphere and held at the elevated temperature. The thin diamond film was formed by a microwave plasma assisted CVD method using $CH_4+H_2$ as feed gases. The program of its growth was as shown in FIG. 1 and the conditions of growth were as follows:

Feed gas: $CH_4$, $H_2$ ($CH_4/H_2=6\%$)
Growth pressure: 40 Torr
Substrate temperature: 850° C.
Microwave Power: 400 W The feed gases $CH_4$ and $H_2$ were those for growing an undoped thin diamond film. For forming a thin film of p-type diamond, $B_2H_6$ should also be introduced ($B_2H_6/CH_4=50$ ppm). Comparative Example 1 is identical to Example 1 except no pre-treatment with a chlorine containing gas was performed.

(1) Effect of the temperature for HCl treatment on surface layer production

Figure 3:
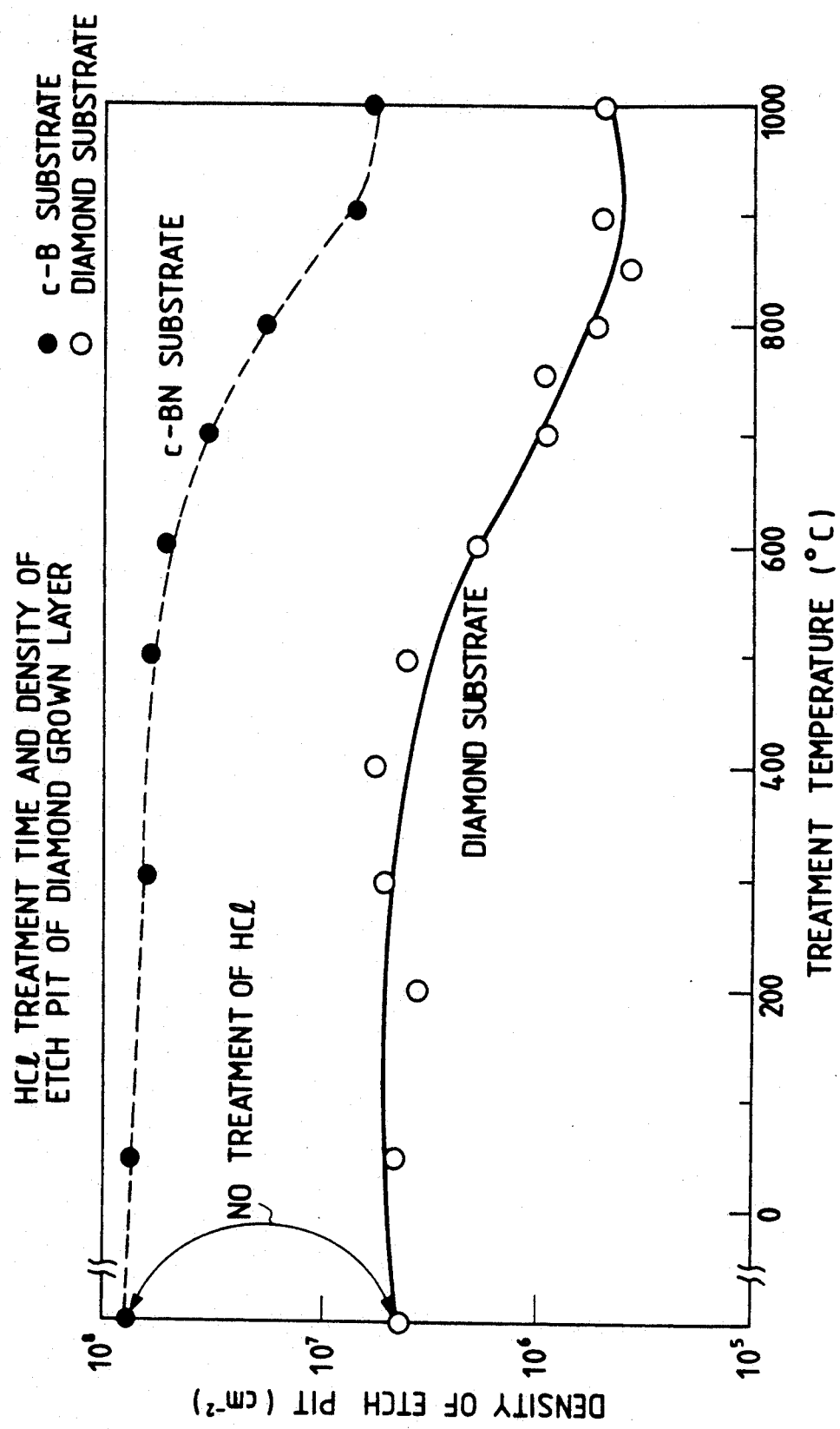
FIG. 3 shows the relationship between the number of etch pits in the diamond layer and the temperature for HCl pre-treatment.

The method of Example 1 is characterized by cleaning the substrates with chlorine gas prior to the growth of diamond. To verify the effectiveness of the use of Cl gas, the number of etch pits formed in the grown diamond layer was examined. The dependence of the density of etch pits in the grown diamond layer on the temperature for HCl treatment was determined, with the temperature being varied from R.T. to 1,000° C. The results are shown in FIG. 3. In the experiment, an undoped diamond layer was grown in a thickness of ca. 2 $\mu$m and with a specific face direction (100). Etch pits were formed in the grown layer using molten $KNO_3$ (600° C.) for 1 h.

The horizontal axis of the graph in FIG. 3 plots the process temperature and the vertical axis plots the etch pit density ($cm^{-2}$); the symbols ● and ○ denote that the thin diamond film was grown the C-BN and diamond substrates, respectively. The results obtained in the absence of HCl treatment are shown at the left end of the graph.

When the c-BN substrate was not treated with HCl, the etch pit density was on the order of $10^8$ $cm^{-2}$ but when the substrate was pre-treated with HCl at 800° C. and above, the etch pit density decreased to about $10^7$ $cm^{-2}$. With the diamond substrate, the etch pit density was on the order of $5\times10^6$ $cm^{-2}$ when no HCl treatment was performed. When the substrate was treated with HCl at 800° C. and above, the etch pitch density decreased to about $6-8\times10^5$ $cm^{-2}$. Treatment with HCl was also effective even when it was performed at 600°-800° C.

Thus, the density of etch pits in the diamond grown layer could be reduced by performing HCl treatment at temperatures of 600°-800° C. and above. With either substrate, treatment with HCl at temperatures of 800° C. and above reduced the etch pit density to $\frac{1}{2}$-1/10 of the values obtained when no treatment with HCl was conducted (as indicated at the left end of FIG. 3)

The above results show that treatment with HCl at elevated temperatures is effective in improving the crystallinity of the diamond layer which is grown on the substrate. Better crystallinity leads to reduced scattering of carriers due to defects and hence, it should contribute to a higher carrier mobility. To verify this assumption, the following experiment was conducted.

Figure 4:
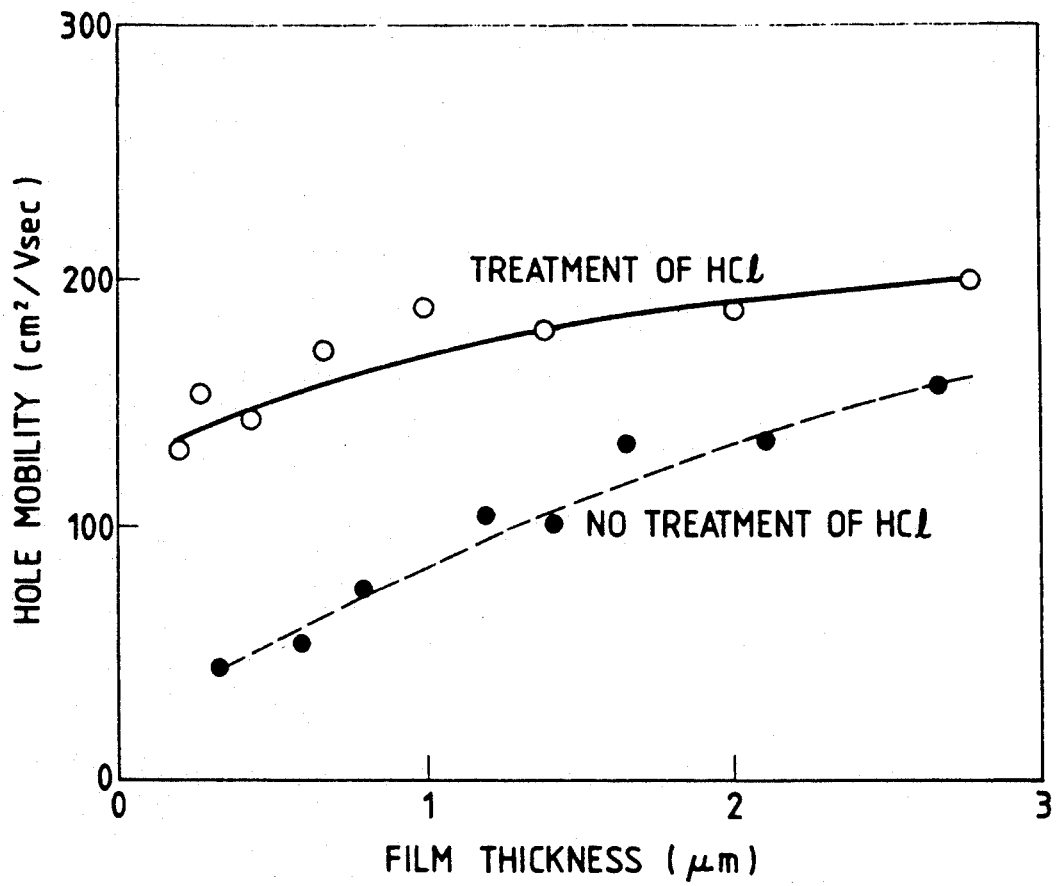
FIG. 4 shows the relationship between hole mobility and the thickness of the diamond layer for HCl pre-treatment.

(2) Dependence of the carrier mobility of the grown layer on the film thickness in the presence and absence of HCl treatment The hole mobility of boron-doped, p-type ($B=5-30\times10^{14}$ $cm^{-3}$) grown layer of varying thicknesses was measured for the case where HCl treatment was conducted at 900° C. for 10 min and for the case where no HCl treatment was conducted. Both substrates and the grown layer were made of diamond. The results of hole mobility measurements are shown in FIG. 4. The horizontal axis of the graph in FIG. 4 plots the film thickness ($\mu$m) and the vertical axis plots the hole mobility ($cm^2$/Vsec); ○ refers to data obtained when an HCl pre-treatment was conducted; ● refers to data when no HCl treatment was conducted.

As can be seen, higher hole mobilities were achieved when HCl treatment was conducted. The layers which were grown on the substrate treated with HCl had hole mobilities of 180-200 $cm^2$/Vsec for film thicknesses of 2-3 $\mu$m. In contrast, when no HCl treatment was conducted, the hole mobility was 120-150 $cm^2$/Vsec for the same film thickness range.

Thus, even thick grown layers had higher mobilities when the substrate was treated with HCl. However, the difference caused by the presence or absence of HCl treatment is most apparent when the film thickness is small. In the absence of HCl treatment, the mobility of holes decreases rapidly as the thickness of the grown thin film layer decreases. This occurs because of the strong influences on the film caused by defects at the interface between the substrate and thin film. However, in the presence of HCl treatment, hole mobilities in the range of 130-160 $cm^2$/V·sec were attained even when the film thickness was as small as 0.2 to 0.5 $\mu$m. These values are two to three times as high as those attained in the absence of HCl treatment.

While the above data refers to the results for the case of using a diamond substrate, it should be mentioned that similar tendencies were observed when a c-BN substrate was used.

Figure 5:
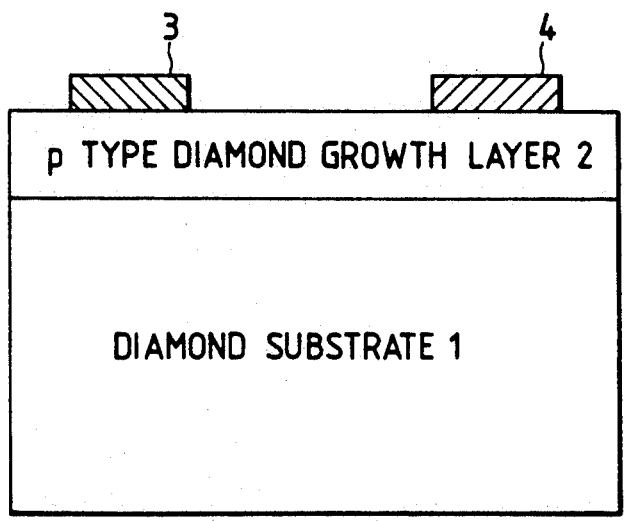
FIG. 5 shows a Schottky diode containing the film layers of the present invention.

In order to investigate the electrical characteristics of the thin film prepared by the method described in Example 1, a Schottky diode having the structure shown in FIG. 5 was fabricated using a film sample with a thickness of 1 $\mu$m. As shown, a p-type diamond layer 2 was grown on a diamond substrate 1. Electrodes 3 and 4 were then provided on the diamond layer 2. The ohmic electrode 4 was formed by vacuum evaporation of titanium (Ti) whereas the Schottky electrode 3 was formed of tungsten (W) by the same method. A diode was formed between the Schottky electrode and the grown, p-type diamond layer.

The characteristics of a diode can be evaluated in terms of a quality factor and reverse leak current. The power of e (the base of natural logarithm) in the mathematical expression for current I flowing through a diode contains a coefficient gV/nkt, where q is the quantity of electric charge, V is the voltage applied to the pn junction, k is the Boltzman constant, and T is the temperature in Kelvin. The quality factor is represented by n in the coefficient and the diode characteristics are ideal when n=1. As n becomes greater than unity, the forward current flowing at a given voltage will decrease. Needless to say, the reverse leak current should be as small as possible. The quality factor (value of n) of the Schottky diode and the leak current flowing at a reverse bias of 50 V were measured for both the case where HCl treatment was conducted and the case where no HCl treatment was conducted. The results are shown in Table 1.

TABLE 1

Quality factor and leak current for the case where the substrate was subjected to HCl treatment and for the case where no HCl treatment was performed

|  | Value of n | Leak current (A) |
|---|---|---|
| Comp. Ex. 1 No HCl treatment | 2.10 | $7.8 \times 10^{-11}$ |
| Ex. 1 HCl treatment | 1.75 | $1.1 \times 10^{-11}$ |

As the above table shows, the crystallinity of a grown diamond layer was improved by performing HCl treatment on the substrate. This allowed the production of an improved Schottky diode which had small values for n and the leak current.

(3) Dependence of properties of the thin film on the type of gas used in the preliminary treatment; Examples 2 to 7

The method of Example 1 is characterized by preliminary treatment of the substrate with HCl containing gas. However, a variety of chlorine containing gases may be used, suitable gases include, HCl, $Cl_2$, $CCl_4$, etc. The effectiveness of the preliminary treatment varies with the type of chlorine containing gases used. The following examples demonstrate the extent of this effect.

After performing the preliminary treatment of the substrate using a variety of chlorine containing gases at varying temperatures and pressures, according to the method of example 1, thin films of B-doped, p-type diamond were grown epitaxially with a thickness of 1 μm under the same conditions as used in Example 1. In each example, the time of preliminary treatment was 10 min. In some examples, a microwave induced plasma was applied and in the others, no plasma was applied. This was done in order to examine the effects of a microwave induced plasma. The results of measurements of hole density and mobility in the resulting thin layers are shown in Table 2.

TABLE 2

Conditions of preliminary treatment using various chlorine containing gases and the hole mobility of grown thin films

| | Conditions of Pre-treatment | | | Evaluation of grown layer | |
|---|---|---|---|---|---|
| Gas | Temperature °C. | Pressure Torr | Microwave induced plasma, W | Hole density $cm^{-3}$ | Mobility $cm^2/V.S.$ |
| Ex. 2 HCl + $H_2$ | 800 | 12 | none | $1.2 \times 10^{15}$ | 173 |
| Ex. 3 HCl + $H_2$ | 800 | 15 | *200 | $1.4 \times 10^{15}$ | 100 |
| Ex. 4 HCl + $H_2$ | 900 | 760 | none | $1.4 \times 10^{15}$ | 175 |
| Ex. 5 $Cl_2$ + $H_2$ | 900 | 20 | none | $0.98 \times 10^{15}$ | 112 |
| Ex. 6 $Cl_2$ + $H_2$ | 900 | 23 | *200 | $1.1 \times 10^{15}$ | 130 |
| Ex. 7 $CCl_4$ + $H_2$ | 950 | 20 | none | $1.3 \times 10^{15}$ | 146 |
| Comp. Ex. 1 | no preliminary treatment | | | $0.43 \times 10^{15}$ | 83 |

As in clear from Table 2, not only HCl systems, but also $Cl_2+H_2$ and $CCl_4+H_2$ systems were effective in improving the hole density and hole mobility of epitaxially grown diamond layers, when the appropriate conditions for preliminary treatment were used.

It can also be seen that equally good results were obtained whether a microwave induced plasma was present or not in the preliminary treatment. When no preliminary treatment was conducted, the hole mobility and the hole density was decreased.

While the foregoing description of Examples 1–7 are the growth of a thin diamond film, it should be noted that the preliminary treatment conducted in accordance with the present invention is equally effective in enhancing the growth of thin c-BN films of improved quality.

EXAMPLE 8

Treatment with Fluorine Gas

A type Ib diamond substrate and an undoped c-BN substrate, each produced by a high-pressure synthesis method, were used as the substrates for the pre-treatment and growth process, as in Example 1. A thin diamond film was grown on these substrates. The conditions of preliminary treatment and epitaxial growth were substantially the same as those used in Example 1.

Prior to placement in a growth chamber, each of the diamond and C-BN substrates was cleaned by sonication with an organic solvent, treated with fluoronitric acid and aqua regia, and rinsed with ultrapure water. These treatments were identical to the corresponding treatments in Example 1. In Example 8, HF gas was used as a fluorine containing gas to clean the substrates instead of the HCl gas used in Example 1.

The treatment which occurred prior to the growth of a thin diamond film, was conducted under the following conditions:

| | |
|---|---|
| Gas flow rate: | HF = 5 sccm |
| | H2 = 300 sccm |
| Pressure: | 12 Torr |
| Process Temperature: | R.T. - 1,000° C. |
| Process time: | 10 min |

Following the pre-treatment, after removal of the pre-treatment gas, a thin diamond film was grown on the treated substrates. The thin diamond film was formed using a microwave plasma assisted CVD method with $CH_4 + H_2$ as feed gases. The process of the diamond film's growth was as shown in FIG. 1 and the conditions of growth were as follows:

Feed gas: $CH_4$, $H_2$ ($CH_4/H_2 = 6\%$)
Growth pressure: 40 Torr
Substrate temperature: 850° C.
Microwave power: 400 W The feed gases $CH_4$ and $H_2$ were those for growing an undoped thin diamond film. As already mentioned, when a thin film of p-type diamond is to be formed, $B_2H_4$ should also be introduced ($B_2H_4/CH_4 = 50$ ppm).

(1) Effect of temperature variation on the efficiency of HF pre-treatment

Figure 6:
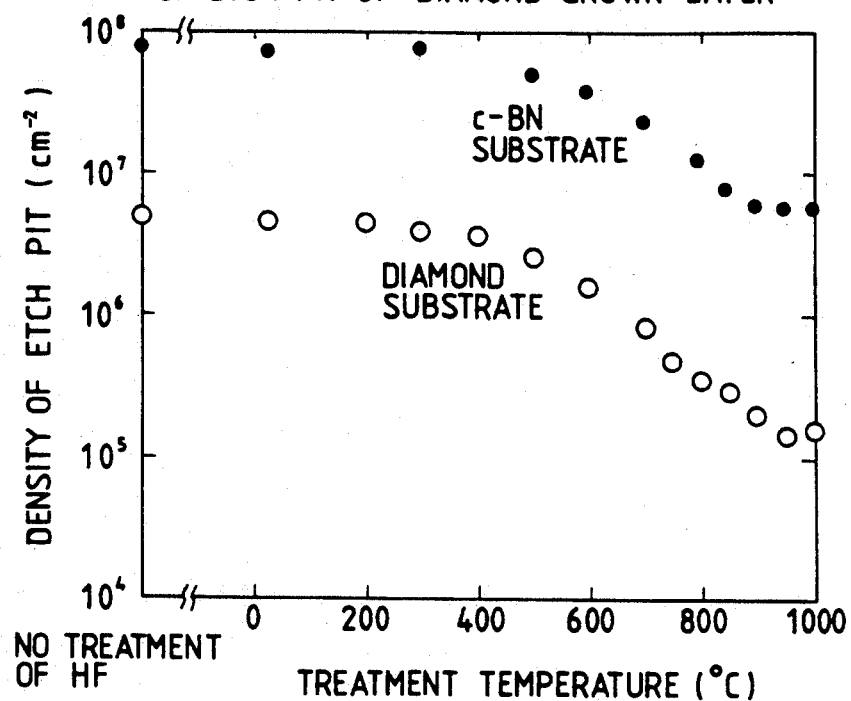
FIG. 6 shows the relationship between the number of etch pits in the diamond layer and the temperature for HF pre-treatment.

The method of Example 8 is characterized by the cleaning of the substrates using a fluorine containing gas prior to the growth of the diamond film. To verify the effectiveness of HF gas, the number of etch pits formed in the grown diamond layer was examined. The dependence of the density of the etch pits formed in the grown diamond layer on the temperature for HF treatment, which was varied from R.T. to 1,000° C., is shown in FIG. 6. In Example 8, an undoped diamond layer was grown in a thickness of ca. 2 μm and in a face direction (100). Etch pits were formed in the grown layer using molten $KNO_3$ (600° C.) for 1 h.

The horizontal axis of the graph in FIG. 6 plots the process temperature and the vertical axis plots the etch pit density ($cm^{-2}$); the symbols ● and ○ denote that the thin diamond film was grown on the c-BN and diamond substrates, respectively. The comparative results obtained when no pre-treatment was conducted are shown at the left end of the graph.

When the c-BN substrate was not treated with HF, the etch pit density was on the order of $10^8$ $cm^{-2}$ but when it was treated with HF at 800° C. and above, the etch pit density decreased to about $10^7$ $cm^{-2}$ and below. When the diamond substrate was used, the etch pit density was on the order of $5 \times 10^6$ $cm^{-2}$ when no pre-treatment with HF was conducted. When the diamond substrate was treated with HF at a temperature of 800° C. and above, the etch pitch density decreased to about $2-4 \times 10^5$ $cm^{-2}$. Treatment with HF was also effective even when performed at a temperature in the range 600°-800° C.

Thus, the density of etch pits in the grown layer could be reduced by the performance of HF treatment on the diamond substrate at temperatures of 600°-800° C. and above. Regardless of whether the substrate was made of diamond or c-BN, treatment with HF at 800° and above reduced the etch pit density to 1/5-1/10 of the values obtained when no treatment with HF was conducted. The comparative data is indicated at the left end of FIG. 6.

The above results show that treatment with HF at elevated temperatures is effective in improving the crystallinity of the diamond layer which is grown on the substrate. Better crystallinity leads to reduced scattering of carriers due to defects and should contribute to higher carrier mobility. To verify this assumption, the following example was conducted.

Figure 7:
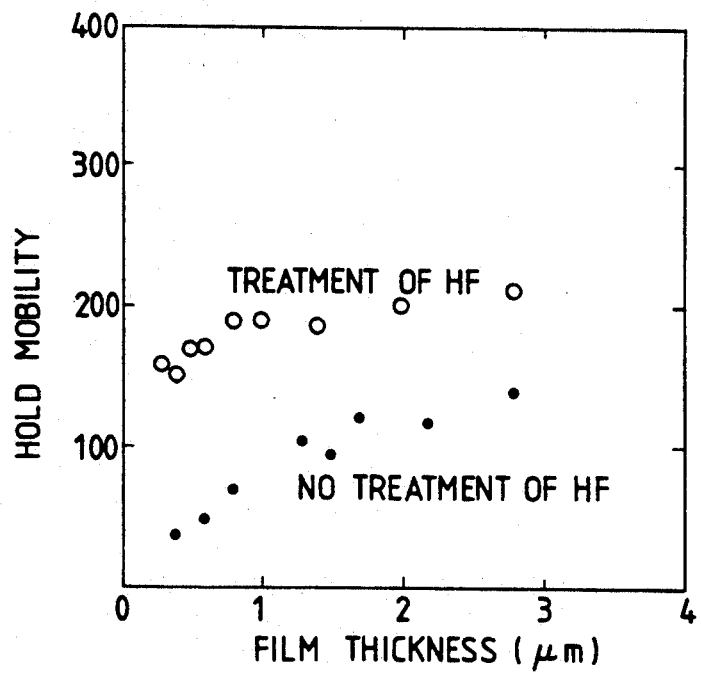
FIG. 7 shows the relationship between film thickness and hole mobility for HF pre-treatment.

(2) Comparison of the dependence of the carrier mobility in the grown layer on the film thickness with and without HF pre-treatment The hole mobility of boron-doped, p-type ($B = 5-30 \times 10^{14}$ $cm^{-3}$) grown layers with a variety of thicknesses was measured in examples where HF pre-treatment was conducted at 900° C. for 10 min and for comparative examples where no HF pre-treatment was conducted. Both the substrate and the grown layer were made of diamond. The resulting hole mobility measurement are shown in FIG. 7. The horizontal axis of the graph in FIG. 7 plots the film thickness (μm) and the vertical axis plots the hole mobility ($cm^2$/Vsec); ○ refers to data obtained when HF treatment was conducted and ● refers to data where no HF pre-treatment was conducted.

As can be seen, higher hole mobilities are achieved when HF pre-treatment is conducted on the substrate. The layers grown on the substrate which was treated with HF had hole mobilities of 200-210 $cm^2$/Vsec for film thicknesses of 2-3μ. When no HF pre-treatment was conducted on the substrate, the hole mobility was 120-140. $cm^2$/Vsec for the same film thickness range.

Thus, even thick grown layers had higher mobilities when the substrate was treated with HF. However, as in Example 1, the advantages of the performance of the HF pre-treatment on the substrate are most apparent when the film thickness is small. In the absence of HF treatment of the substrate, the hole mobility decreases rapidly as the thickness of the grown layer decreases. This occurs because of the strong influence on the film caused by defects at the interface between the substrate and the thin film. However, when HF treatment of the substrate is conducted, the dependence of hole mobility on the film thickness was small. Mobilities in the range of 150-170 $cm^2$/Vsec were attained even when the film thickness was as low as 0.2-0.5 μm. These values are three to four times as high as those attained when no HF treatment of the substrate is conducted.

While the above data refers to the results for the case of using a diamond substrate, it should be mentioned that similar tendencies were observed when a c-BN substrate was used.

In order to investigate the electrical characteristics of the thin film prepared by the method described in Example 8, a Schottky diode having the structure shown in FIG. 5 was fabricated using a film sample with a thickness of 1 μm. As shown, a p-type diamond layer 2 was grown on a diamond substrate 1 and a tungsten (W) Schottky electrode 3 and a titanium (Ti) ohmic electrode 4 were provided on the diamond layer 2.

As mentioned in Example 1, the characteristics of a diode can be evaluated in terms of a quality factor and a reverse leak current. The quality factor (value of n) of the Schottky diode and the leak current which flowed at a reverse bias of 50 V were measured for both the case where HF treatment was conducted and the case where no HF treatment was conducted. The results are shown in Table 3.

TABLE 3

Quality factor and leak current for the case where the substrate was subjected to HF treatment and for the case where no HF treatment was performed

|  | Value of n | Leak current (A) |
| --- | --- | --- |
| No HF treatment | 2.15 | $8.1 \times 10^{-11}$ |
| HF treatment | 1.70 | $1.0 \times 10^{-11}$ |

As the above table shows, the crystallinity of the grown diamond layer was improved by performing HF treatment on the substrate. This allows the fabrication of an improved Schottky diode which has small values of n and leak current.

(3) Effect of the type of gas used in the preliminary treatment on the thin layer's characteristics (Examples 9–14).

The method of Example 8 is characterized by a preliminary treatment of the substrate with an HF containing gas. However, there are various other fluorine containing gases which are suitable for use in the present process. These gases include $F_2$, and $CF_4$. The effectiveness of the preliminary treatment varies with the type of fluorine containing gases which is used. Examples 9–14 compare the effects of using a variety of gases for the pre-treatment of the substrate.

After performing the preliminary treatment of the substrate using a variety of fluorine containing gases at a variety of temperatures and pressures, thin films of B-doped, type diamond were grown epitaxially on the substrate. These films had a thickness of 1 μm and were grown under the same conditions as used in Example 8. In each example the time of preliminary treatment was 10 min. In some examples, a microwave induced plasma was applied and in the others, no plasma was applied. This allowed examination of the effects of a microwave induced plasma. Hole density and mobility were measured in the grown layers and the results are shown in Table 4.

growth was the same as in Examples 1 and 8 (see FIG. 1).

Prior to placing in a growth chamber, the c-BN substrate it was cleaned by sonication with an organic solvent, treated with fluoronitric acid and aqua regia, and rinsed with ultrapure water. The conditioned substrate was then place on a susceptor in a microwave plasma assisted growth apparatus. The vacuum chamber was closed and a vacuum was drawn. The substrate was then heated using a microwave induced plasma while $H_2$ gas was passed over the substrate. During the treatment with microwave plasma, the temperature of the substrate was held slightly above the growth temperature. The plasma treatment was performed in the same space of the vacuum chamber the diamond layer was to be grown. The microwave induced plasma was generated using one or more of the following gases: $H_2$, $N_2$, Ar and $O_2$ gases. The conditions of plasma treatment were as follows:

CONDITIONS OF PLASMA TREATMENT

Gas flow rate ($H_2$, $N_2$, Ar or $O_2$): 50–300 sccm
Pressure: 1–40 Torr
Microwave power: 50–800 W
Process time: 10–60 min

TABLE 4

Conditions of preliminary treatment using various flourine containing gases and the hole mobility of grown thin films

| | Treatment Conditions | | | Effect on Thin Layer | |
| --- | --- | --- | --- | --- | --- |
| Gas | Temperature °C. | Pressure Torr | Microwave induced plasma, W | Hole density $cm^{-3}$ | Mobility $cm^2/V.S.$ |
| Ex. 9 HF + $H_2$ | 800 | 14 | none | $1.3 \times 10^{15}$ | 185 |
| Ex. 10 HF + $H_2$ | 800 | 18 | *100 | $1.5 \times 10^{15}$ | 173 |
| Ex. 11 HF + $H_2$ | 900 | 760 | none | $1.4 \times 10^{15}$ | 181 |
| Ex. 12 $F_2$ + $H_2$ | 900 | 20 | none | $1.0 \times 10^{15}$ | 134 |
| Ex. 13 $F_2$ + $H_2$ | 900 | 25 | *200 | $1.2 \times 10^{15}$ | 145 |
| Ex. 14 $CF_4$ + $H_2$ | 950 | 18 | none | $1.4 \times 10^{15}$ | 160 |
| Comp. Ex. 2 | no preliminary treatment | | | $0.51 \times 10^{15}$ | 79 |

As in clear from Table 4, not only HF but also $F_2+H_2$ and $CF_4+H_2$ systems were effective in improving the hole density and hole mobility of the epitaxially grown layers when the other conditions of the preliminary treatment were appropriate.

It can also be seen that equally good results were obtained whether or not a microwave induced plasma was present in the preliminary treatment. When no preliminary treatment was conducted, not only the hole mobility but also the hole density decreased.

While the foregoing description is of the growth of a thin diamond film, it should be noted that the preliminary treatment conducted in accordance with the present invention is equally effective in permitting the growth of thin c-BN films of improved quality.

EXAMPLE 15

Pre-Treatment of the Substrate with Nitrogen or Hydrogen Plasma

An undoped c-BN substrate produced by a high-pressure synthesis method was chosen as the substrate for this example. This substrate was subjected to a preliminary treatment with a nitrogen or hydrogen plasma and a thin film of diamond film was formed on the treated substrate. The thin diamond film was formed using a microwave plasma assisted CVD process using $CH_4+H_2$ as feed gases. The program for thin film Without the use of a separate heater, the temperature of the substrate was elevated to about 300°–1,200° C. using the microwave induced plasma.

After the plasma treatment, a thin film of diamond was grown on the c-BN substrate within the same vacuum chamber without allowing any drop in the temperature. The conditions for the diamond film growth were as follows.

Feed gas: $CH_4$, $H_2$ ($CM_4/H_2=6\%$)
Growth pressure: 40 Torr
Substrate temperature: 850° C.
Microwave power: 400 W When a thin film of p-type diamond was to be formed, on the substrate, $B_2H_6$ was introduced in addition to the $CH_4$ and $H_2$ ($B_2H_6/CH_4=50$ ppm).

In order to demonstrate the effectiveness of the preliminary treatment of the substrate with a $H_2$ or $N_2$ gas plasma, the effect of a change in plasma power, the dependence of carrier mobility on film thickness for two different cases (one being the case where a plasma treatment was conducted), and the effect of the change in the type of gas used in the preliminary treatment were examined.

(1) Effect of plasma power variation.

The power of the microwave used to form the $H_2$ plasma was varied from 100 to 800 W and the resulting effects on the diamond layer were examined. The conditions of the H$_2$ plasma treatment are shown below.

H$_2$ flow rate: 200 sccm
Pressure: 40 Torr
Process time: 20 min
Substrate: (100) oriented c-BN The temperature of the substrate increased with the microwave power and it was about 550° C. when the microwave power was 100 W and about 1,200° C. when the microwave power was 800 W. The epitaxial layer which was grown was a (100) oriented film of undoped diamond with a thickness of about 2 μm. The crystallinity of the grown layer was evaluated in terms of etch pit density. Etch pits were formed by treating the layer with molten KNO$_3$ (600° C.). This treatment was undertaken for 1 h.

Figure 8:
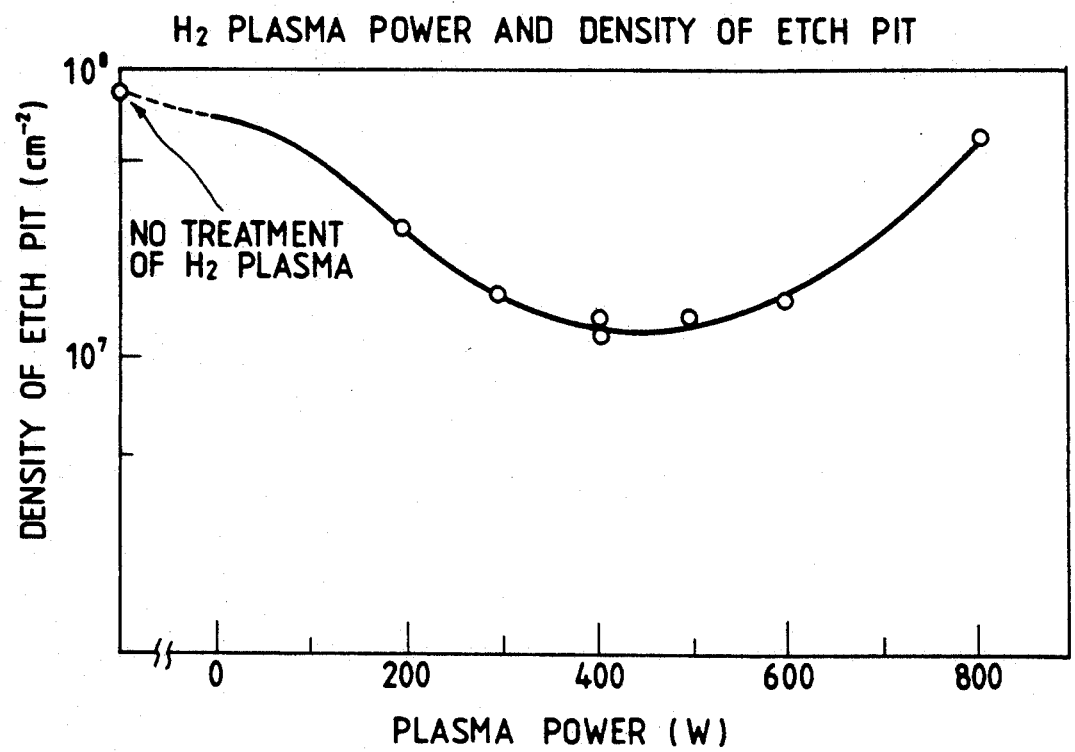
FIG. 8 shows the relationship between the number of etch pits in the diamond layer and the temperature for plasma pre-treatment.

The relationship between the etch pit density of the thin layer and the microwave power is shown in FIG. 8. The horizontal axis of the graph FIG. 8 plots the plasma power (W) and the vertical axis plots the etch pit density (cm$^{-2}$). The value obtained when no H$_2$ plasma treatment was conducted is shown at the left end of the graph.

When no plasma pre-treatment was performed, the etch pit density was on the order of 10$^{-8}$ cm$^{-2}$. When the power was 200 W, the etch pit density decreased to about 3×10$^{-7}$ cm$^{-2}$. With a plasma power of 400 W, the etch pit density decreased to minimum levels of about 1-2×10$^7$ cm$^{-2}$. Beyond 400 W the etch pit density increased with the plasma power. At a plasma power of 800 W, the etch pit density was 6×10$^7$ cm$^{-2}$. FIG. 8 shows that the etch pit density of the grown layer could be significantly reduced by treating the substrate with an H$_2$ plasma at plasma powers between 200-700 W.

Figure 2:
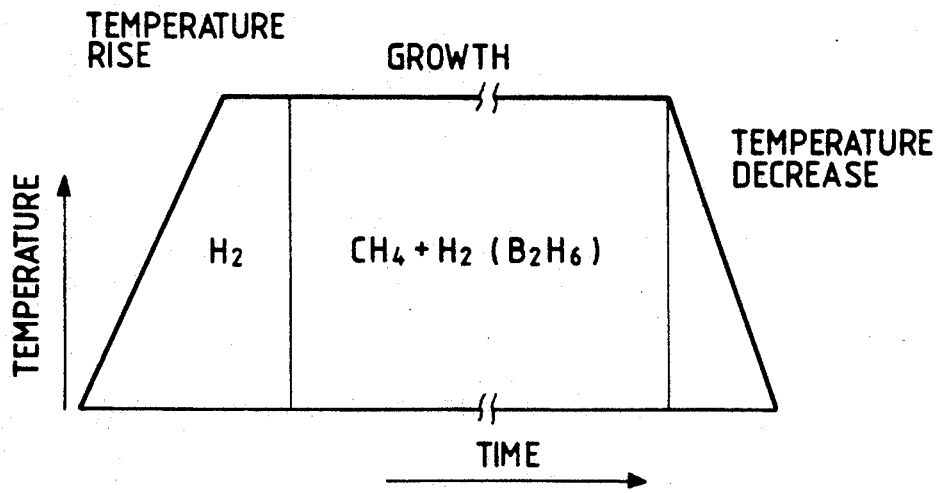
FIG. 2 shows a diagram of the conventional process for forming a thin diamond or c-BN film.

With H$_2$ plasma pre-treatment at plasma powers of about 300-600 W, the etch pit density could be reduced to a level ⅓-1/6 of the value obtained in the absence of H$_2$ plasma treatment, when a feed gas CH$_4$ was introduced at the moment the temperature of the substrate rose to a desired level, in accordance with the growth program shown in FIG. 2. This shows that the H$_2$ plasma treatment is effective in improving the crystallinity of a growth diamond layer.

If the microwave power is excessive (800 W in the example under consideration), the H$_2$ plasma treatment roughens the surface of the substrate and is therefore incapable of improving the crystallinity of the grown layer.

(2) Relationship between film thickness and the hole mobility of the grown layer with or without N$_2$ plasma treatment.

Figure 9:
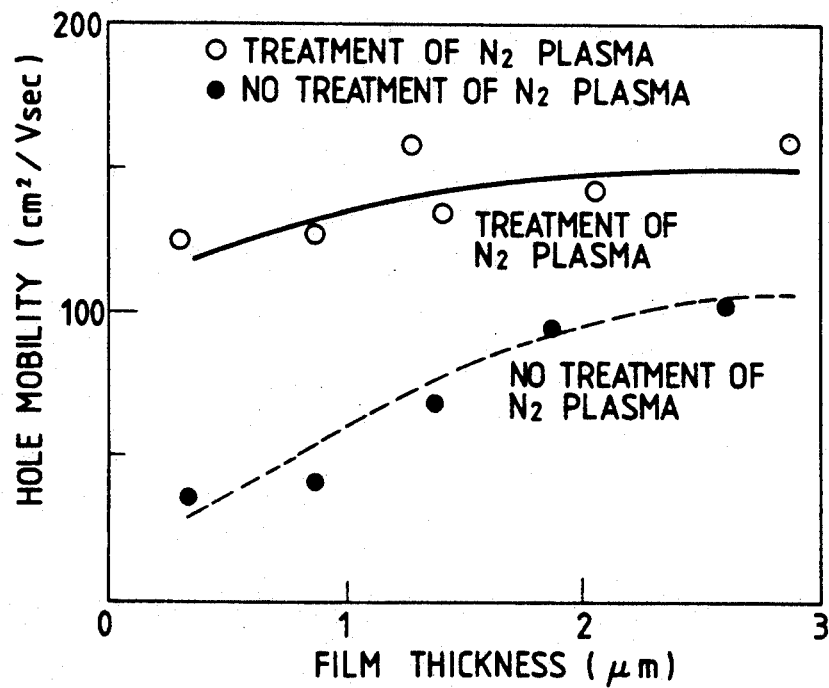
FIG. 9 shows the relationship between hole mobility and film thickness for plasma pre-treatment.

The hole mobility of a boron-doped p-type (B=5-30×10$^{14}$ cm$^-$) diamond layer was measured for a variety of thicknesses. The hole mobility was examined in films grown on substrates when a N$_2$ plasma treatment was conducted (N$_2$ flow rate, 100 sccm; pressure, 30 Torr; microwave power, 400 W; process time, 15 min) and in films grown on substrates where no plasma treatment was conducted. The measurements were conducted using a (100) oriented c-BN substrate. The profile of the relationship between hole mobility and the film thickness is shown in FIG. 9. The horizontal axis of the graph in FIG. 9 plots the thickness of the grown diamond layer (μm) and the vertical axis plots the hole mobility (cm$^2$/V.sec); ○ refers to the case where N$^2$ plasma treatment was conducted and ● refers to the case where no N$_2$ plasma treatment was conducted. In the absence of N$_2$ plasma treatment, the hole mobility decreased rapidly as the thickness of the grown layer decreased. This occurs because stains and work strains on the surface of the substrate exert stronger effects on the quality of the thin film grown on that substrate when the film is thinner.

However, the relationship between the hole mobility and the film thickness was improved when N$_2$ plasma treatment was used on the substrate mobilities of about 120 cm$^2$/V·sec were obtained, even in films as thin as 0.2-0.5 μm. These values were three to four times as great as those obtained when no N$_2$ plasma pre-treatment was performed. In thicker (2-3 μm) films, higher mobilities were also obtained in films grown on substrate subjected to plasma treatment.

In order to investigate the electrical characteristics of the thin film prepared by the method of Example 15, a Schottky diode having the structure shown in FIG. 5 was fabricated using a film sample with a thickness of 1 μm as in Examples 1 and 8. A p-type diamond layer 2 was grown on a C-BN substrate 1 and a tungsten (W) Schottky electrode 3 and a titanium (Ti) ohmic electrode 4 were provided on the diamond layer 2. The quality factor (value of n) of the Schottky diode and the leak current flowing at a reverse bias of 50 V were measured for both N$_2$ plasma treated cases and non N$_2$ plasma treated cases. The results are shown in Table 5.

TABLE 5

Quality factor and leak current for the case where the substrate was subjected to N$_2$ treatment and for the case where no N$_2$ treatment was performed

|  | Value of n | Leak current (pA) |
| --- | --- | --- |
| No N$_2$ plasma treatment | 2.14 | 94 |
| N$_2$ plasma treatment | 1.80 | 16 |

As Table 5 shows, the crystallinity of a grown diamond layer was improved by performing N$_2$ plasma treatment on the substrate. This allowed the construction of an improved Schottky diode which had small values of n and leak current.

(3) Effect of the type of gas used for the plasma in the preliminary treatment (Examples 16-28)

The effectiveness of plasma treatment was investigated by treating the surface of the substrate with plasmas generated from a variety of gases. After performing the preliminary treatment on the substrate for 20 min using these gases at a variety of microwave powers and pressures, thin films of B-doped, p-type diamond were grown epitaxially to a thickness of 1 μm under the same conditions as used in Example 15. The results of measurements of hole density and mobility in the grown layers are shown in Table 6.

TABLE 6

| | Conditions of preliminary treatment | | Evaluation of grown layer | |
| --- | --- | --- | --- | --- |
| Gas | Pressure Torr | Microwave power W | Hole density cm$^{-3}$ | Mobility cm$^2$/V.S. |
| Ex. 16 H$_2$ | 5 | 300 | 3.3 × 10$^{14}$ | 76 |
| Ex. 17 H$_2$ | 40 | 200 | 3.9 × 10$^{14}$ | 88 |
| Ex. 18 H$_2$ | 40 | 500 | 2.6 × 10$^{14}$ | 91 |
| Ex. 19 N$_2$ | 5 | 300 | 5.6 × 10$^{14}$ | 110 |
| Ex. 20 N$_2$ | 10 | 300 | 7.3 × 10$^{14}$ | 102 |
| Ex. 21 N$_2$ | 40 | 300 | 7.0 × 10$^{14}$ | 128 |
| Ex. 22 N$_2$ | 40 | 600 | 9.1 × 10$^{14}$ | 136 |

TABLE 6-continued

| Gas | Conditions of preliminary treatment | | Evaluation of grown layer | |
|---|---|---|---|---|
| | Pressure Torr | Microwave power W | Hole density $cm^{-3}$ | Mobility $cm^2/V.S.$ |
| Ex. 23 $H_2 + N_2$ (1:1) | 40 | 500 | $8.6 \times 10^{14}$ | 153 |
| Ex. 24 Ar | 5 | 500 | $0.95 \times 10^{14}$ | 41 |
| Ex. 25 Ar | 40 | 500 | $1.2 \times 10^{14}$ | 31 |
| Ex. 26 $N_2 + Ar$ (1:1) | 40 | 500 | $4.7 \times 10^{14}$ | 96 |
| Ex. 27 $O_2$ | 10 | 200 | $1.5 \times 10^{14}$ | 33 |
| Ex. 28 $O_2$ | 40 | 400 | $0.80 \times 10^{14}$ | 28 |
| Comp. Ex. 3 | No preliminary treatment | | $1.1 \times 10^{14}$ | 39 |

As can be seen from Table 6, the epitaxial layers grown on the substrates pre-treated with $H_2$ or $N_2$ plasmas had higher hole densities and mobilities than when no preliminary treatment was conducted or when the preliminary treatment was conducted with Ar or $O_2$ plasma. This allowed the fabrication of semiconductor devices that were faster and that permitted a larger current to flow. The same, improved results, were obtained when the preliminary treatment was conducted with a $H_2+N_2$ plasma, a $N_2+Ar$ plasma or other $H_2+N_2$ plasma sources. While the foregoing description of these Examples also centers on the growth of a thin diamond film, it should be understood that the preliminary treatment conducted in accordance with the present invention is equally effective in permitting the growth of improved quality thin c-BN films.

What is claimed is:

1. A method for growing a thin epitaxial film selected from a diamond film and a c-BN film, on a substrate selected from diamond and c-BN, by vapor phase synthesis comprising the steps of:
    (a) placing the substrate in a vacuum chamber
    (b) heating the substrate to a temperature in the range 500° to 1200° C.;
    (c) treating the substrate with a gaseous mixture selected from a chlorine containing gaseous mixture and a fluorine containing gaseous mixture;
    (d) evacuating the gaseous mixture;
    (e) epitaxially growing the thin epitaxial film by introducing a feed gas under chemical vapor deposition conditions.

2. A method as claimed in claim 1, wherein the gaseous mixture is a chlorine containing gaseous mixture.

3. A method as claimed in claim 2, wherein the chlorine containing gaseous mixture comprises a chlorine containing compound selected from HCl, $CCl_4$, and $Cl_2$.

4. A method as claimed in claim 1, wherein the gaseous mixture is a fluorine containing gaseous mixture.

5. A method as claimed in claim 4, wherein the fluorine containing gaseous mixture comprises a fluorine containing compound selected from HF, $CF_4$, and $F_2$.

6. A method as claimed in claim 1, wherein the feed gas for epitaxially growing the thin layer is selected from a mixture of $CH_4$ and $H_2$.

7. A method as claimed in claim 1, wherein step (c) takes place at a temperature in the range 800°-1000° C.

8. A method as claimed in claim 6 wherein the feed gas also comprises $B_2H_6$.

9. A method for growing a thin epitaxial film selected from a diamond film and a c-BN film, on a substrate selected from diamond and c-BN, by vapor phase synthesis comprising the steps of:
    (a) placing the substrate in a vacuum chamber
    (b) elevating the temperature of the substrate to a temperature in the range 500°-1200°
    (c) treating the substrate with a nitrogen plasma;
    (d) evacuating the gaseous mixture;
    (e) epitaxially growing the thin epitaxial film by introducing a feed gas under chemical vapor deposition conditions.

10. A process according to claim 9, wherein the plasma inducing microwave power is 200-700 W.

* * * * *